United States Patent
He et al.

(10) Patent No.: US 8,963,288 B2
(45) Date of Patent: Feb. 24, 2015

(54) ESD PROTECTION CIRCUIT

(71) Applicant: Macronix International Co., Ltd., Hsin-Chu (TW)

(72) Inventors: Chieh Wei He, Kaohsiung (TW); Qi An Xu, Jiangsu Province (CN); Jun Jun Yu, Jiangsu Province (CN); Han Hao, Jiangsu Province (CN)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 13/740,805

(22) Filed: Jan. 14, 2013

(65) Prior Publication Data
US 2014/0197450 A1 Jul. 17, 2014

(51) Int. Cl.
*H01L 29/93* (2006.01)
*H01L 27/08* (2006.01)
*H01L 27/088* (2006.01)
*H01L 27/02* (2006.01)

(52) U.S. Cl.
CPC .............. *H01L 27/08* (2013.01); *H01L 27/088* (2013.01); *H01L 27/0248* (2013.01); *Y10S 257/91* (2013.01)

USPC ................... 257/601; 257/910; 257/E29.281; 361/56

(58) Field of Classification Search
USPC ..................... 257/910, 601, E29.281; 361/56
See application file for complete search history.

(56) References Cited

U.S. PATENT DOCUMENTS 6,867,957 B1 3/2005 Tong et al.
7,525,779 B2 4/2009 Chen et al.

*Primary Examiner* — Amar Movva
(74) *Attorney, Agent, or Firm* — WPAT, PC; Justin King

(57) ABSTRACT

An electrostatic discharge (ESD) protection circuit is coupled between first and second pads to protect an internal circuit therebetween. Under a normal operating condition, a voltage on the first pad is higher than that on the second pad. The ESD protection circuit includes a substrate of a first conductivity type; first well of a second conductivity type in the substrate, wherein the first well is coupled to the first pad; a snapback device housed in the first well; and a diode string in the substrate, connected in series with the snapback device and separated from the first well, wherein the serially connected diode string and snapback device is connected between the first pad and the second pad. With the isolation from the first well, the holding voltage of the ESD protection circuit can be tuned by adjusting the number of diodes in the diode string without using a guard ring.

22 Claims, 15 Drawing Sheets

ESD PROTECTION CIRCUIT

FIELD OF THE INVENTION

The present invention relates in general to an ESD protection circuit, and more particularly to an ESD protection circuit with a tunable holding voltage.

BACKGROUND

Protecting an internal circuit from the threat of ESD damage has been an ongoing challenge for those skilled in the art. Snapback devices are a well-known class of devices that are being adopted in ESD protection circuits. Devices of such a class exhibit a snapback behavior when ESD overstress occurs. FIG. 1 is a diagram showing an I-V curve of a snapback device with a snapback behavior. As illustrated in FIG. 1, when a voltage across the snapback device is below a trigger voltage $V_{trig}$, the snapback device remains cutoff. When the voltage reaches the trigger voltage $V_{trig}$, a p-n junction of the snapback device enters a condition of an avalanche breakdown and triggers a parasitic BJT transistor of the snapback device to turn on and starts conducting a current. Once the snapback device starts conducting a current, the voltage drops to a holding voltage $V_{hold}$, and hence, has snapped back before it starts increasing again. The holding voltage $V_{hold}$ should be higher than an operating voltage $V_{op}$ of the internal circuit preferably by a safety margin to avoid the snapback device so as to stay turned on when the normal operation is resumed or to latch up. In addition, different internal circuits may require different operating voltages, and therefore, the holding voltage $V_{hold}$ should be tunable.

In a conventional approach, one or more diodes are connected in series with the snapback device to impose additional voltage drop to increase the holding voltage $V_{hold}$. However, the attempt is not only unsuccessful, but also exacerbates the low holding voltage issue described above. FIG. 2 is a diagram showing I-V curves of a single snapback device (shown in dotted line) and a snapback device plus a diode (shown in solid line). As illustrated in FIG. 2, the holding voltage $V_{h2}$ of the snapback device in series with a diode is much lower than the holding voltage $V_{h1}$ of the single snapback device, indicating that an extra current conducting path has been activated.

In another conventional approach, a guard ring structure is inserted between the one or more diodes and the snapback device whereby holes and electrons flowing in the substrate can be captured, and thereby the extra current conducting path is suppressed from being activated. Though the additional guard ring structure assists the one or more diodes to serve the intended purpose, it may occupy much more layout area for the guard ring structure itself and the extra layout spacing required.

Therefore, it is desirable to provide an ESD protection circuit with a tunable holding voltage that requires less additional layout area.

SUMMARY OF THE INVENTION

The objective of the present invention is to provide an ESD protection circuit. In the ESD protection circuit, a well with a different conductivity type to the substrate in which it embeds, is added to surround a snapback device for dissipating an ESD current. Additionally, a doped region is formed in the well to be electrically coupled to a voltage pad susceptible of introducing an ESD current to the ESD protection circuit in a forward ESD mode. With the isolation from the well, the holding voltage of the ESD protection circuit, based on the holding voltage of the snapback device, can be tuned by adjusting the number of diodes in series with the snapback device without the complement of a guard ring structure, thereby saving layout area.

The invention achieves the above-identified object by providing an ESD protection circuit connected between a first pad and a second pad. Under a normal operating condition, a voltage on the first pad is higher than a voltage on the second pad. The ESD protection circuit includes a substrate of a first conductivity type; a first well of a second conductivity type in the substrate; a snapback device housed in the first well; and a diode string in the substrate. The first well is coupled to the first pad. The diode string is connected in series with the snapback device and separated from the first well. The serially connected diode string and snapback device is connected between the first pad and the second pad.

The invention achieves the above-identified object by providing an ESD protection circuit connected between a first pad and a second pad. Under a normal operating condition, a voltage on the first pad is higher than a voltage on the second pad. The ESD protection circuit includes a substrate of a first conductivity type; a first well of a second conductivity type in the substrate; a device well of the first conductivity type in the first well; a first doped region of the second conductivity type in the device well; a second doped region of the second conductivity type in the device well and coupled to the second pad; a first gate between the first and second doped regions and over the device well; and at least one diode region. Each diode region comprises: a diode well within the substrate; a third doped region of the first conductivity type in the diode well; and a fourth doped region of the second conductivity type in the diode well. The first well is coupled to the first pad. The device well is coupled to the second pad. The second doped region and the gate are coupled to the second pad. The at least one diode region is connected in series with the first doped region and couples the first doped region to the first pad.

The invention achieves the above-identified object by providing an ESD protection circuit connected between a first pad and a second pad. Under a normal operating condition, a voltage on the first pad is higher than a voltage on the second pad. The ESD protection circuit includes a substrate of a first conductivity type; a first well of a second conductivity type in the substrate; a first device well of the first conductivity type in the first well; a second device well of the second conductivity type in the first device well; a first doped region of the first conductivity type in the second device well; a second doped region of the second conductivity type in the first device well and at least one diode region. Each diode region comprises a diode well within the substrate; a third doped region of the first conductivity type in the diode well; and a fourth doped region of the second conductivity type in the diode well. The first well is coupled to the first pad. The first device well and the second device well are coupled to the second pad and the first pad, respectively. The first doped region is coupled to the first pad. The at least one diode region is connected in series with the second doped region and couples the second doped region to the second pad.

BRIEF DESCRIPTION OF THE DRAWINGS

The invention will be described according to the appended drawings in which.

DETAILED DESCRIPTION OF THE INVENTION

The embodiments of the present invention are described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. As used herein, the term "or" is an inclusive "or" operator, and is equivalent to the term "and/or," unless the context clearly dictates otherwise. In addition, throughout the specification, the meaning of "a," "an," and "the" include plural references. The term "coupled" implies that the elements may be directly connected together or may be coupled through one or more intervening elements.

Figure 1:
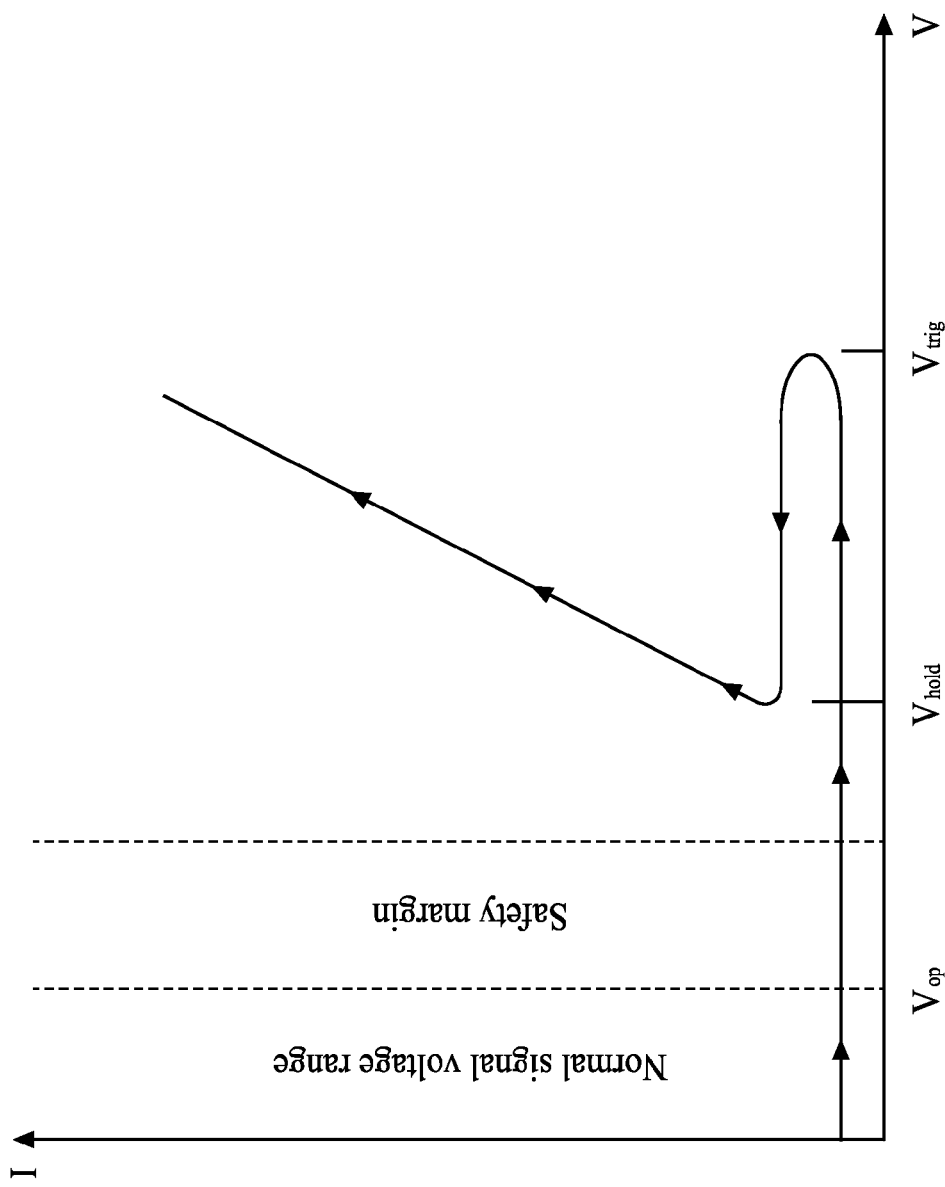
FIG. 1 is a diagram showing an I-V curve of a snapback device with a snapback behavior.
Figure 2:
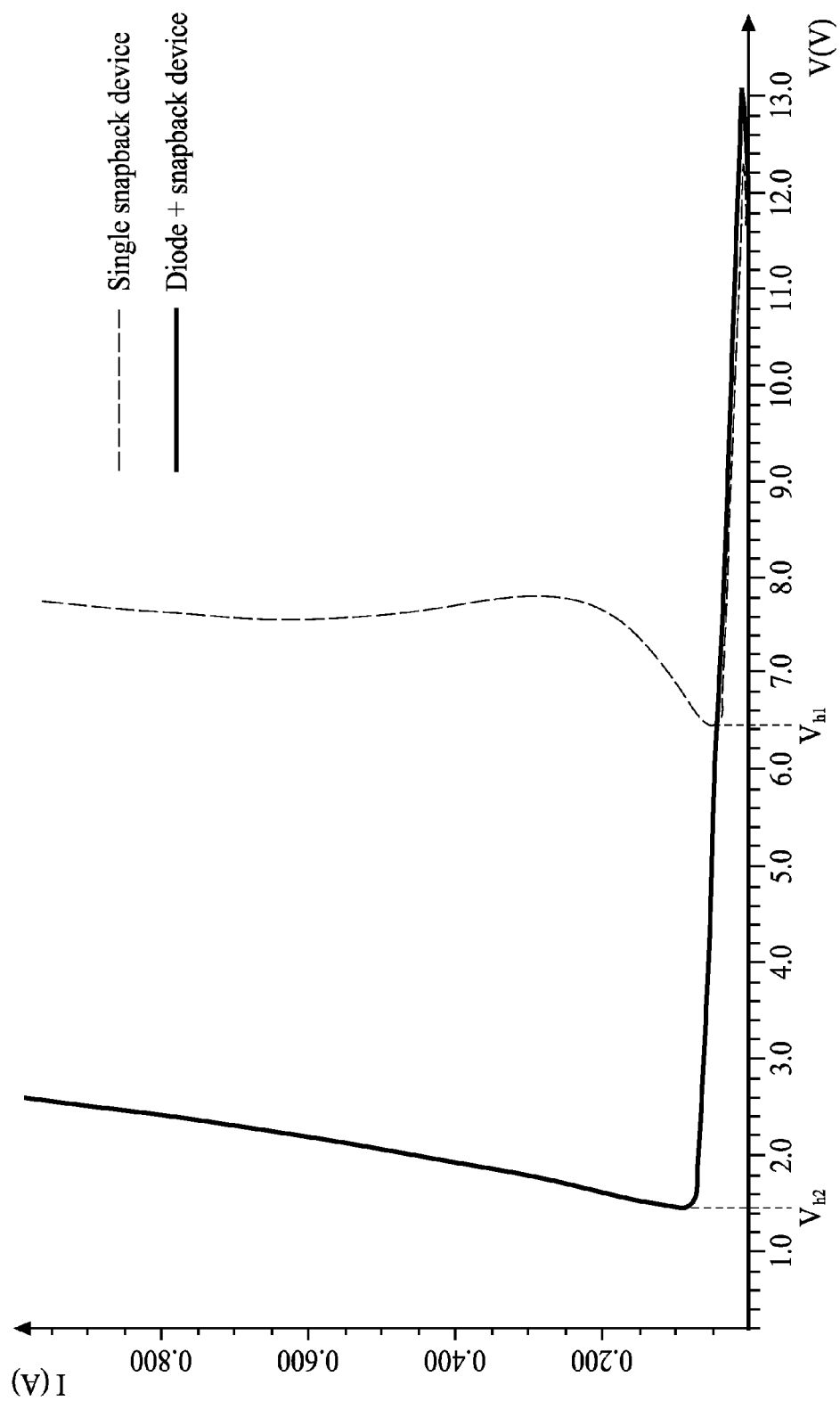
FIG. 2 is a diagram showing I-V curves of a single snapback device and a snapback device plus a diode.
Figure 3:
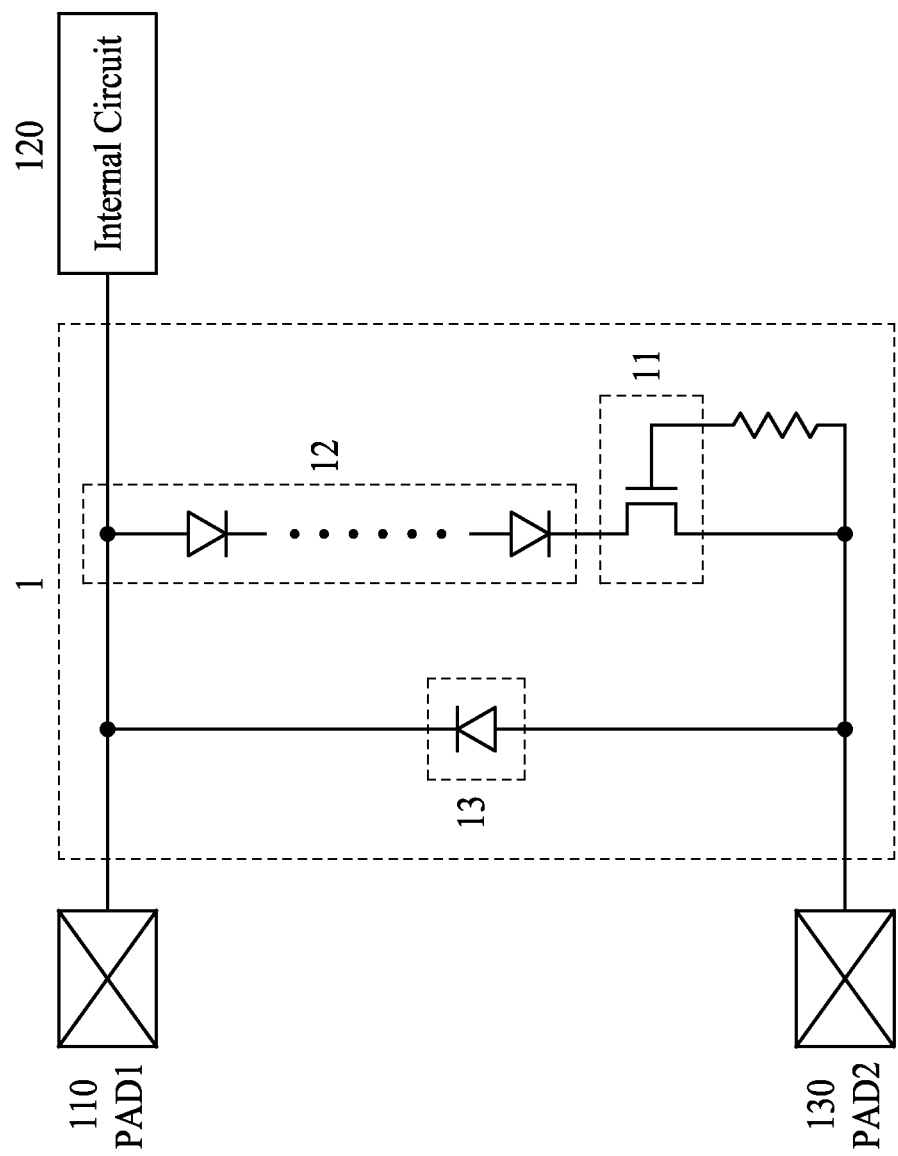
FIG. 3 schematically illustrates an equivalent circuit of the ESD protection circuit according to embodiments of the present invention.

FIG. 3 is an equivalent circuit diagram schematically illustrating an ESD protection circuit 1 with a tunable holding voltage in accordance with an embodiment of the present disclosure. The circuit 1 may be incorporated into a semiconductor circuit and electrically coupled to a first pad 110, an internal circuit 120, and a second pad 130. A voltage on the first pad 110 is higher than a voltage on the second pad 130 during a normal operating condition. According to an embodiment, the first pad 110 is an I/O pad or a high voltage pad and the second pad is a ground pad. According to other embodiments, the first pad 110 may be a VDD1 pad and the second pad 130 may be a VDD2 pad, or the first pad 110 may be a VSS1 pad and the second pad 130 may be a VSS2 pad.

With the introduction of the ESD protection circuit 1, the internal circuit 120 can be protected from ESD damage or other electrostatic shock. The circuit 1 includes a snapback device 11 and a diode string 12 connected in series with the snapback device 11 for an ESD current to discharge from the first pad 110 to the second pad 130. The snapback device 11, as described above, exhibits the snapback behavior when ESD overstress occurs. In the circuit 1, the snapback device 11 is a ground-gate NMOS (ggNMOS), wherein a source of the NMOS is coupled to the second pad 130, and the drain of the NMOS is coupled to the first pad 110 through the diode string 12. By adjusting the number of diodes in the diode string 12, the holding voltage of the ESD protection circuit 1, based on the holding voltage of the snapback device 11, may be tuned to a level above the voltage on the first pad 110 under the normal operating condition, such as 10.5 V. Moreover, the ESD protection circuit 1 may include a reverse diode 13 for an ESD current to discharge from the second pad 130 to the first pad 110.

Figure 4:
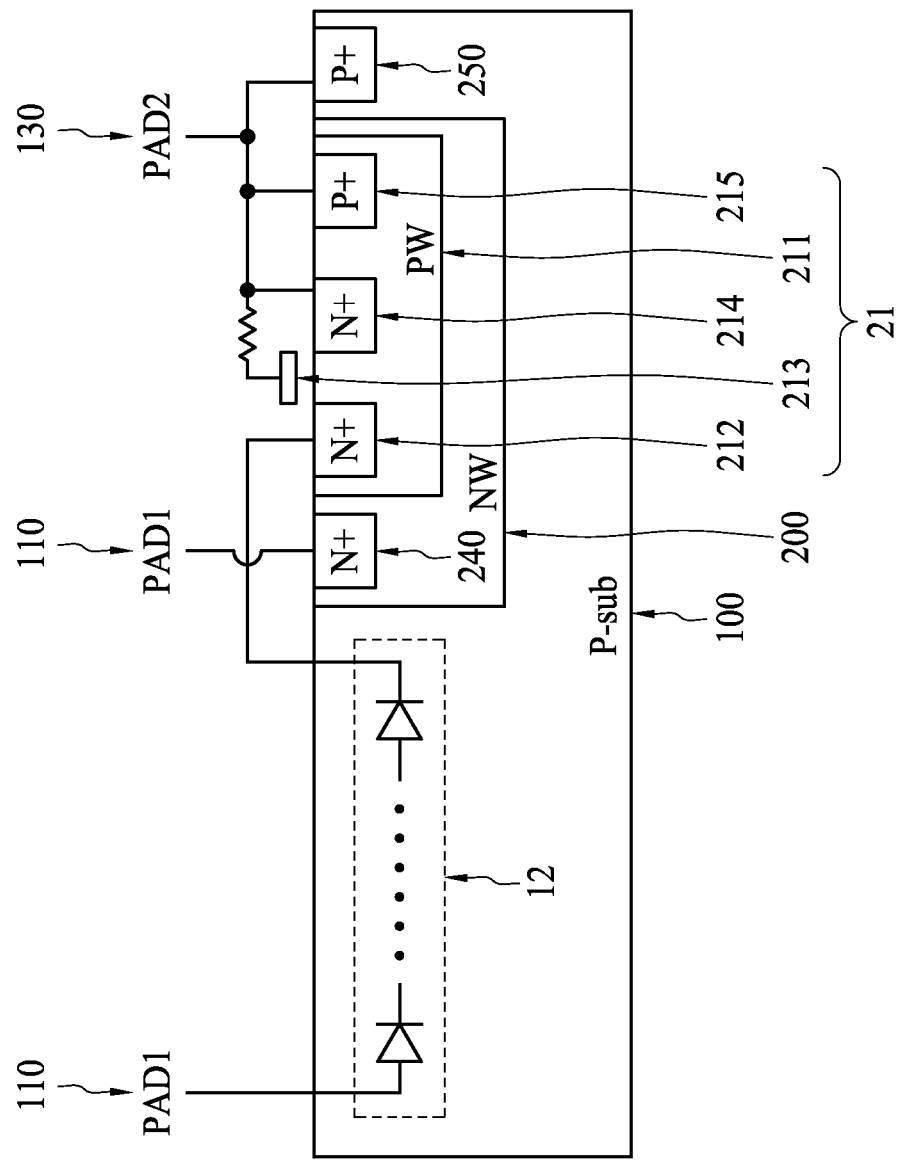
FIG. 4 depicts the semiconductor structure of an ESD protection circuit according to one embodiment.

An embodiment according to the present disclosure of a semiconductor structure of an ESD protection circuit 2 is depicted in FIG. 4. The ESD protection circuit 2 is electrically coupled between a first pad 110 and a second pad 130. A voltage on the first pad 110 is higher than a voltage on the second pad 130 under a normal operating condition. The ESD protection circuit 2 includes a substrate 100, a first well 200, a snapback device 21 and a diode string 12. In this embodiment, the substrate 100 is of a first conductivity type. The first well 200 of a second conductivity type is disposed in the substrate 100, wherein the first well 200 is coupled to the first pad 130. The snapback device 21 is housed in the first well 200. The diode string 12 is disposed in the substrate 100 and electrically connected in series with the snapback device 21 and separated from the first well 200, wherein the serially connected diode string 12 and the snapback device 21 is connected between the first pad 110 and the second pad 130. In this embodiment, the first conductivity type is opposite to the second conductivity type. In this embodiment, the first well 200 is coupled to the first pad 110 through a more heavily doped region 240 of the second conductivity type in the first well 200. The substrate 100 is coupled to the second pad 130 through a more heavily doped region 250 of the first conductivity type in the substrate 100.

Referring still to FIG. 4, in this embodiment, the first conductivity type is a P-type and the second conductivity type is an N-type. In this embodiment, the snapback device 21 is a ggNMOS. The snapback device 21 includes a first NMOS, wherein the first NMOS includes a device well 211 of the first conductivity type in the first well 200, a drain 212, a source 214 and a body 215 in the device well 211, and a gate 213 over the device well 211, wherein the gate 213, source 214 and body 215 of the first NMOS are coupled to the second pad 130, and the drain 212 of the first NMOS is coupled to the first pad 110 through the diode string 12.

Figure 7:
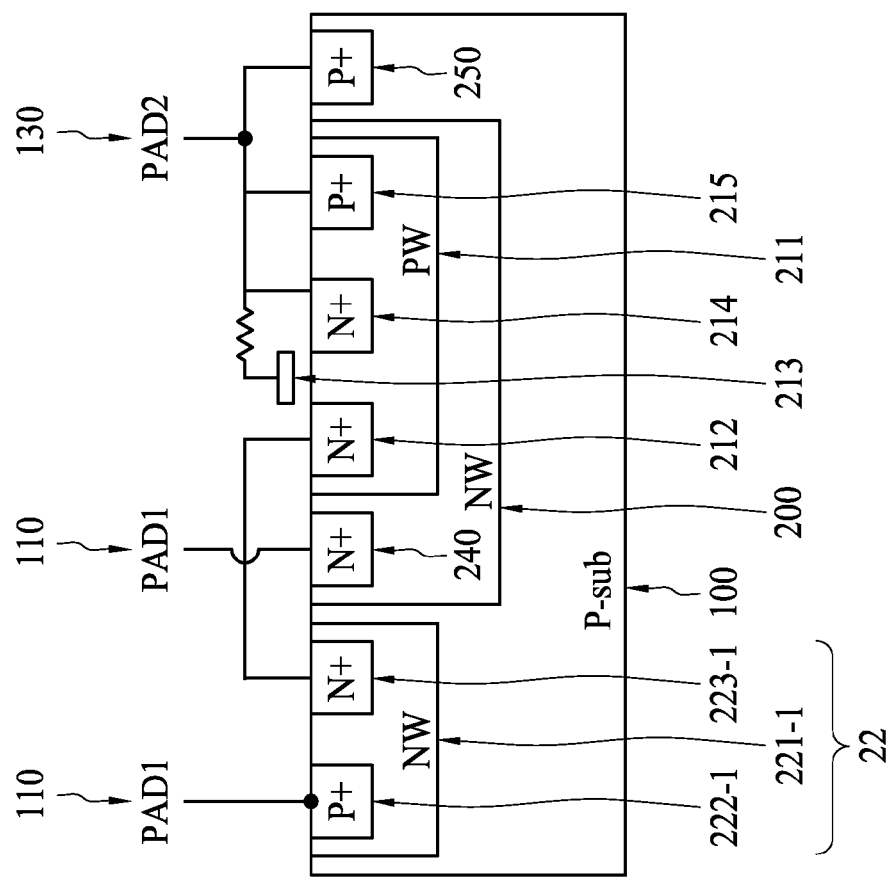
FIG. 7 depicts the representative cross-sectional drawing of an ESD protection circuit according to one embodiment.

Referring still to FIG. 4, by enclosing the snapback device 21 in the first well 200 coupled to the first pad 110, the holding voltage of the ESD protection circuit 2, based on the holding voltage of the snapback device 21, may be tuned to a level above the voltage on the first pad 110 under the normal operating condition. FIG. 7 includes an example of a cross-sectional view of the diode string 12 shown in FIG. 4. Referring to both FIG. 4 and FIG. 7, when the first well 200 is not present, a parasitic silicon-controlled rectifier (SCR) path will be constructed by a PNP BJT transistor formed by a P+ doped region 222-1 and an N well 221-1 of a diode in the diode string 22 and the P substrate 100, and also constructed by an NPN BJT transistor composed by the N well 221-1, the P substrate 100 and the source 214 of the NMOS. The PNP BJT transistor and the NPN BJT transistor form a positive feedback structure that can enter a regenerative current-conducting state and lower the holding voltage of the snapback device 21. By enclosing the snapback device 21 in the first well 200, which is coupled to the first pad 110, the parasitic SCR path is blocked and the holding voltage of the ESD protection circuit 2 based on the holding voltage of the snapback device 21 may be tuned to a level above the voltage on the first pad 110 under the normal operating condition without using a conventional guard ring structure. The guard ring structure, if exists, would be an additional N well with an N+ doped region and an additional P+ doped region present in the portion of the P-substrate 100 between the diode string 12 and the snapback device 21.

Referring back to FIG. 4, there is another diode which is the junction formed by a contact interface of the substrate 100 and the first well 200, wherein the conducting direction of the diode is the reversal to that of the diode string 12 in view of the first pad 110. In this embodiment, the first well 200 is directly coupled to the first pad 110 by directly connecting the N+ doped region 240 to the first pad 110.

The present embodiment provides at least two different channels for dissipating the ESD current introduced from different directions. When the discharging current is introduced into the circuit from the first pad 110, also called a forward ESD mode in the present disclosure, the high current travels through the diode string 12, the drain 212, the device well 211 and the source 214 of the first NMOS of the snapback device 21, and then to the second pad 130. Conversely, when the discharging current is introduced from the second pad 130, also referred to as a negative stress (NS) mode in the present disclosure, the high current may dissipate through the substrate 100, the first well 200, and then to the first pad 110. By embedding the first well 200 in the substrate 100 to surround the snapback device 21 and directly coupling the first well 200 to the first pad 110, it becomes unnecessary to reserve an extra layout area to have a reverse diode for discharging NS mode ESD current.

Figure 5:
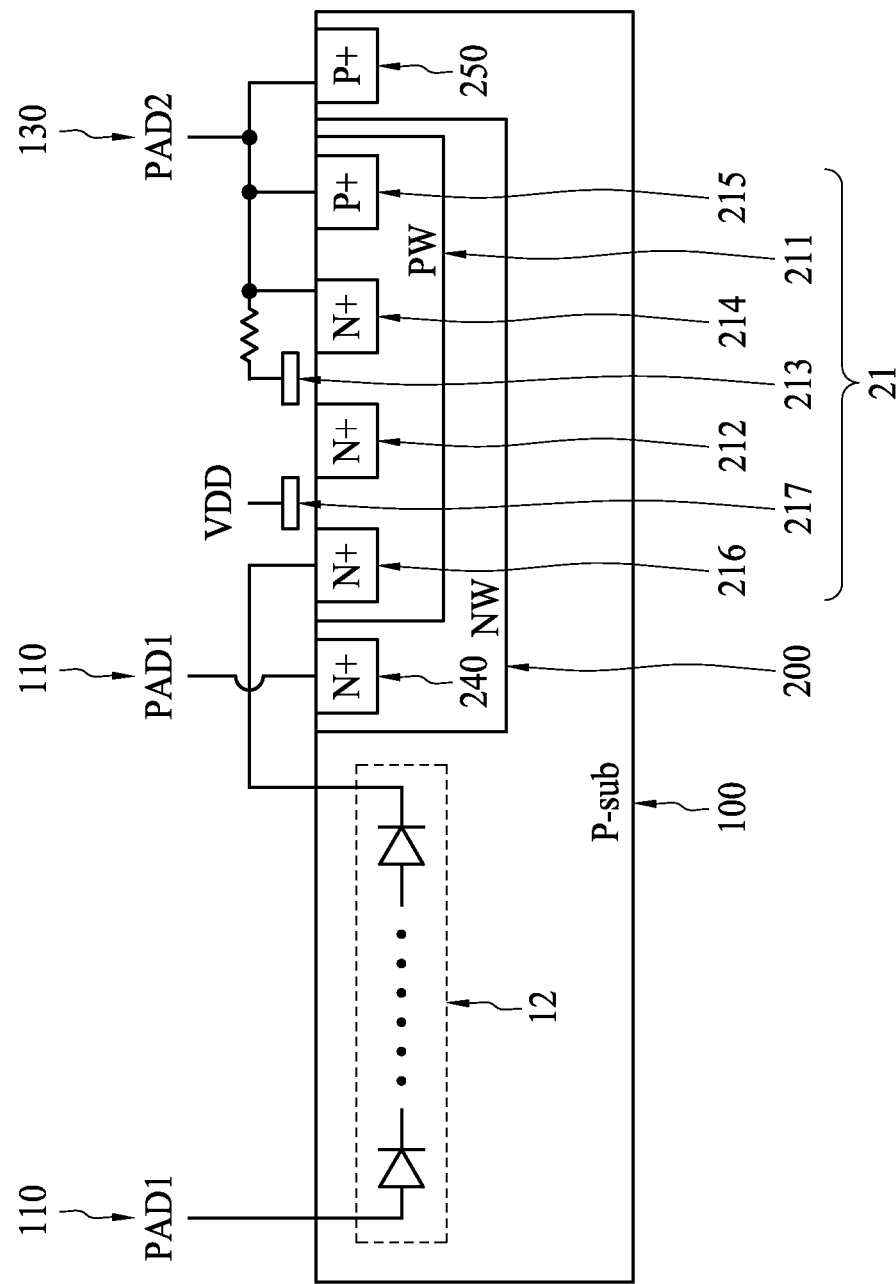
FIG. 5 depicts the semiconductor structure of an ESD protection circuit according to another embodiment.

FIG. 5 depicts another embodiment in which the snapback device 21 further includes a second NMOS in cascade with the first NMOS. This embodiment is different from the embodiment illustrated in FIG. 4 in that the snapback device 21 includes a second NMOS in addition to the first NMOS. The second NMOS is cascaded with the first NMOS which means the first NMOS shares the device well 211 with the second NMOS, and a source 212 of the second NMOS and the drain 212 of the first NMOS are shared. A drain 216 of the second NMOS is coupled to the first pad 110 through the diode string 12, and a gate 217 of the second NMOS is coupled to a control voltage to lower the trigger voltage of the snapback device 21. In this embodiment, the control voltage is equal to VDD.

Figure 6:
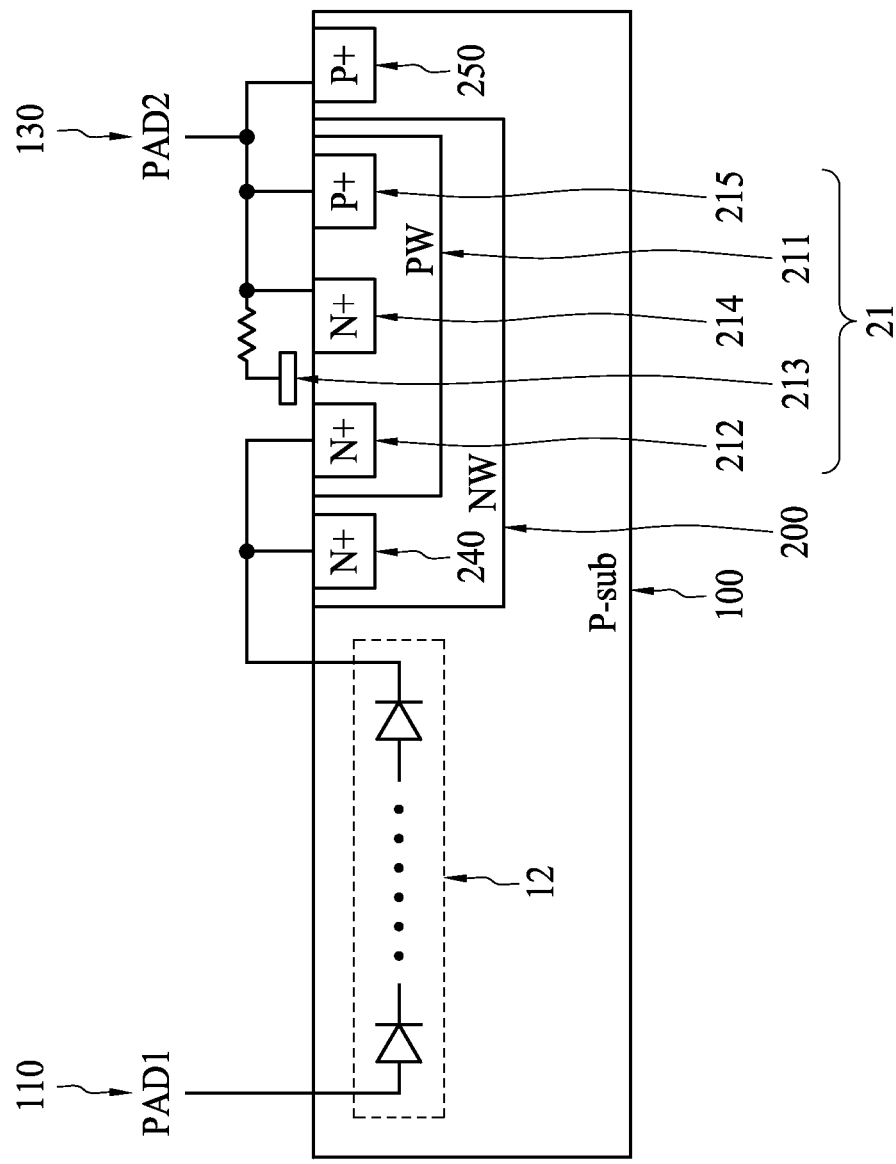
FIG. 6 depicts the semiconductor structure of an ESD protection circuit iu according to still another embodiment.

FIG. 6 illustrates another embodiment in which the first well 200 is coupled to the first pad 110 through the diode string 12. This embodiment is different from the embodiment illustrated in FIG. 4 in that the first well 200 is coupled to the first pad 110 through the diode string 12 instead of being directly coupled to the first pad 110.

Figure 8:
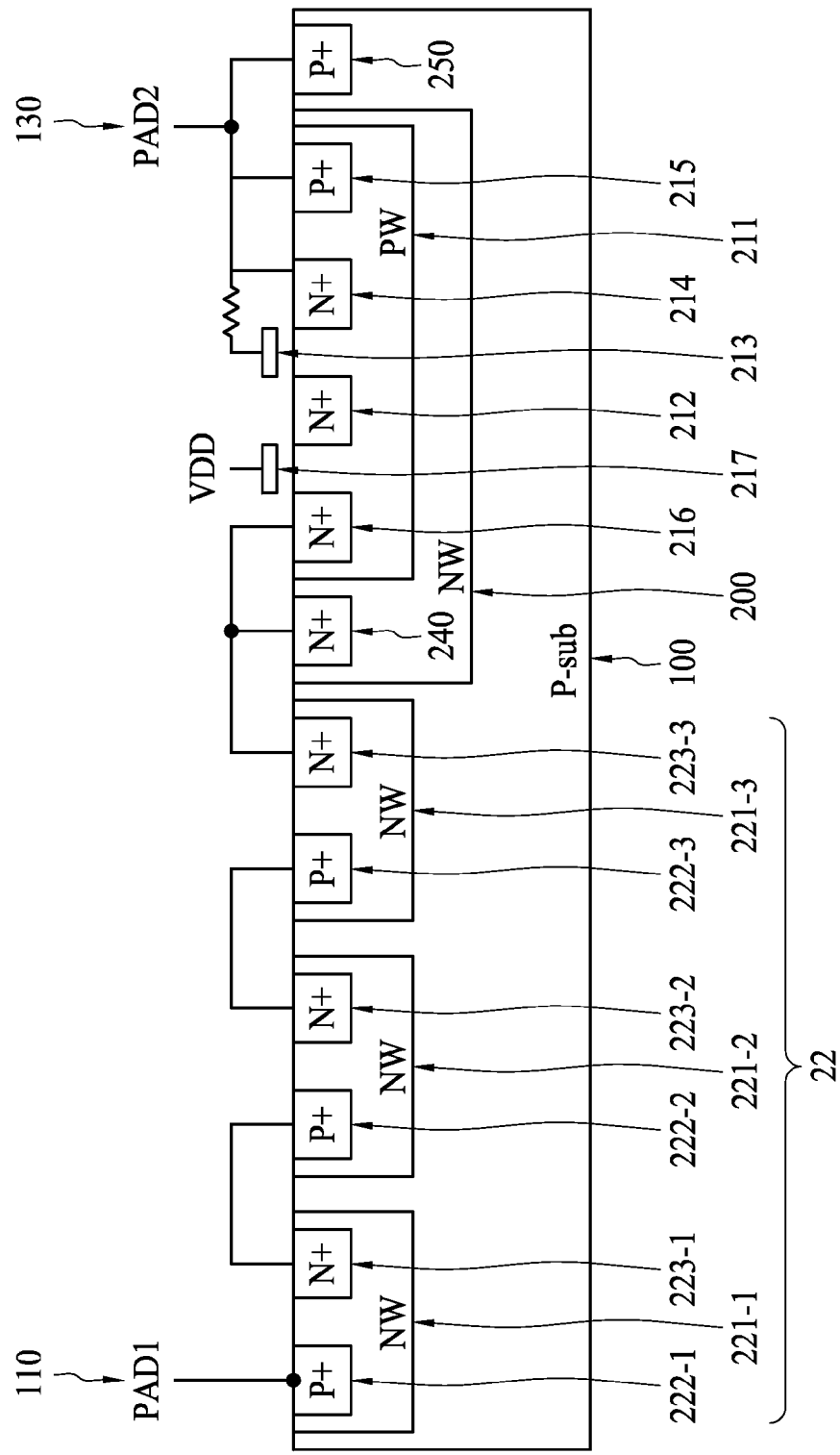
FIG. 8 depicts the representative cross-sectional drawing of an ESD protection circuit according to another embodiment.

FIG. 7 and FIG. 8 depict embodiments in which the diode string 22 includes a single diode and a plurality of diodes, respectively. Referring to both FIG. 7 and FIG. 8, the diode string 22 includes an end anode 222-1 and an end cathode 223-$n$, where n is equal to 1 in the example shown in FIG. 7 and is equal to 3 in the example shown in FIG. 8. The end anode 222-1 is coupled to the first pad 110 and the end cathode 223-$n$ is coupled to the drain 212 of the first NMOS.

Figure 9:
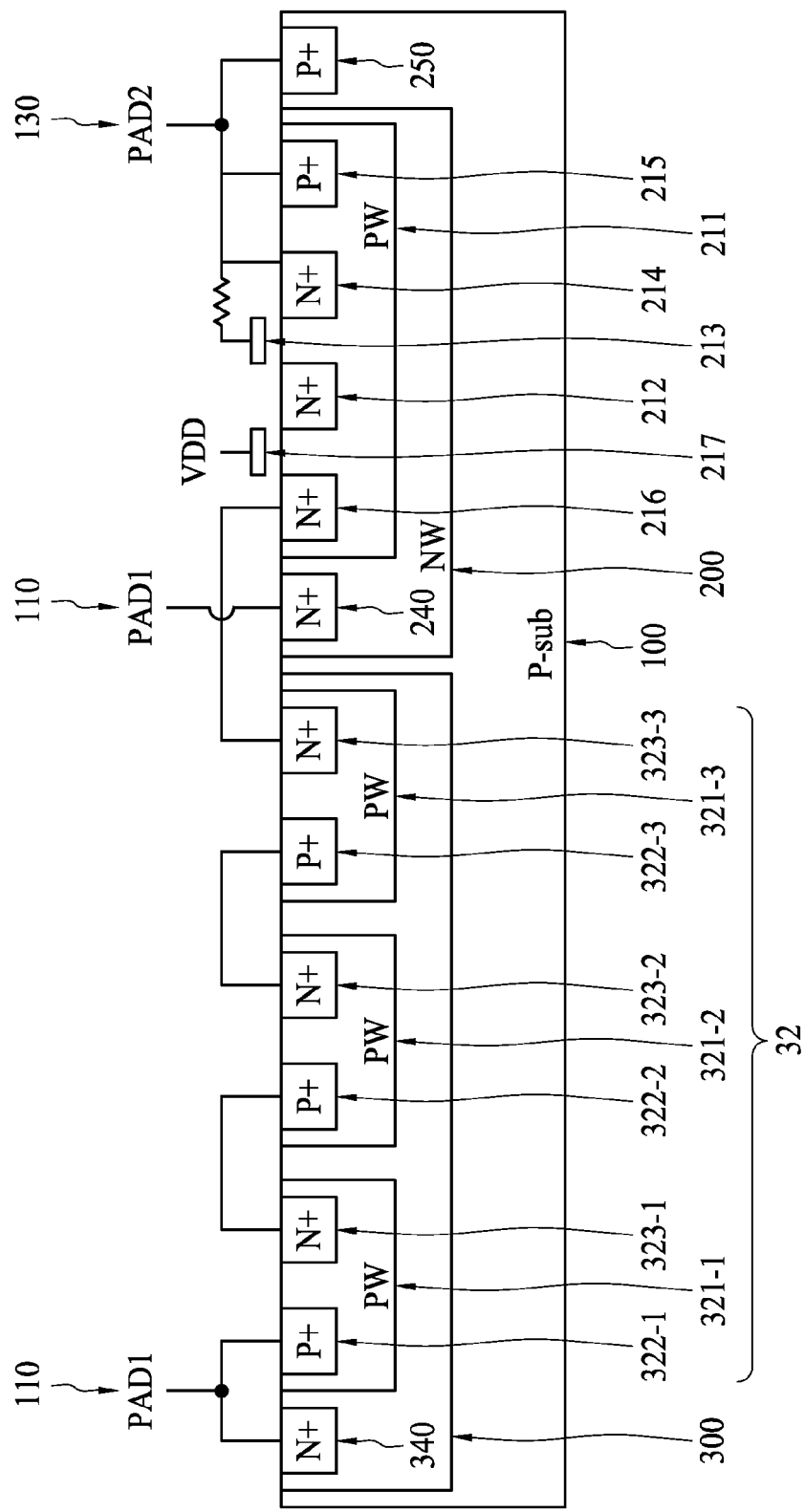
FIG. 9 depicts the representative cross-sectional drawing of an ESD protection circuit according to still another embodiment.

FIG. 9 depicts an embodiment in which the diode string 32 is housed in a second well 300. The second well 300 of the second conductivity type is embedded in the substrate 100, and is coupled to the first pad 110. The diode string 32 is enclosed in the second well 300 and each diode in the diode string 32 includes a diode well 321-$x$ of the first conductivity type, an anode 322-$x$ in the diode well 321-$x$, and a cathode 323-$x$ in the diode well 321-$x$, where x denotes the $x_{th}$ diode in the diode string 32. In this embodiment, the second well 300 is coupled to the first pad 110 through a more heavily doped region 340 of the second conductivity type in the second well 300.

The embodiments illustrated in FIG. 8 and FIG. 9 are different in that the diode string 22 in FIG. 8 is directly embedded in the substrate 100 while the diode string 32 in FIG. 9 is enclosed by the second well 300 and then embedded in the substrate 100. During the normal operation, a bias voltage is applied on the first pad 110 in order to drive the internal circuit. Ideally, the ESD protection circuit 2 coupled to the first pad 110 should be non-current conducting to avoid any power consumption. Unfortunately, in the embodiment shown in FIG. 8, the P+ doped region 222-$x$ and the N well 221-$x$ of each diode in the diode string 22, and the P substrate 100 constitute a parasitic PNP BJT transistor and may form a channel for leakage. In Particular, when the number of diodes in series increases, because the PNP BJT transistors are inherently in the Darlington transistor configuration, the leakage current of a PNP BJT transistor will be amplified by the next PNP BJT transistor. By replacing the N well 221-$x$ of each diode in the diode string 22 shown in FIG. 8 with a P well 321-$x$ in FIG. 9, and then enclosing the diode string 32 in the N well 300 coupled to the first pad 110, the electrical potential difference on the interface between the P well 321-$x$ and the N well 300 may form a barrier to the leakage current from the P well 321-$x$. For the first diode in the diode series 32, the electrical potential in the P well 321-1 may be equivalent to the electrical potential in the N well 300. But for the second and other subsequent diodes, the potential difference at an interface of the P well 321-$x$ and the N well 300 will be higher due to the voltage drop from the series connection, and the higher potential barriers formed outside the diodes can block the leakage. By further adjusting the doping concentration or profile of the wells, the embodiment may provide a higher potential barrier at the interface to block the leakage current. Therefore, the embodiment illustrated in FIG. 9 not only achieves tunable holding voltage without a guard ring structure, but also enhances power consumption under the normal operating condition.

Figure 10:
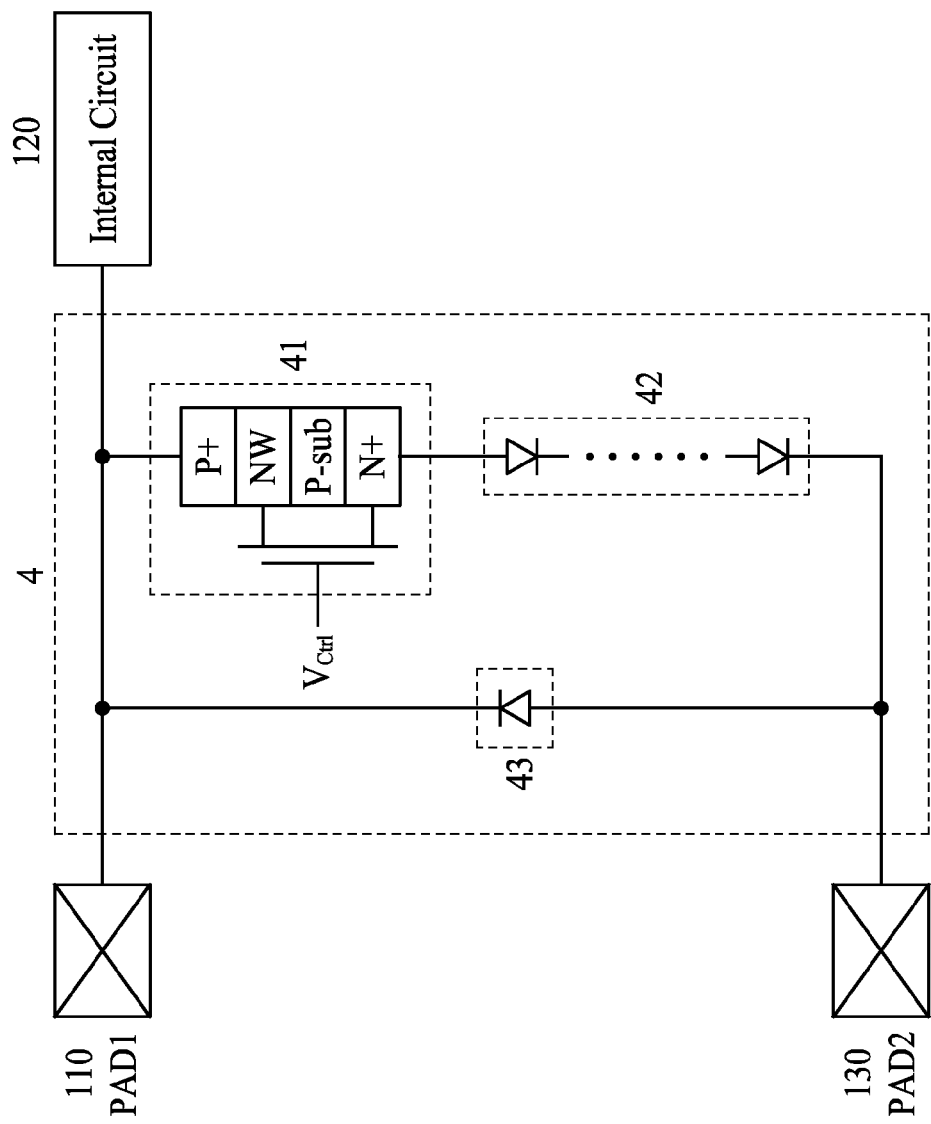
FIG. 10 schematically illustrates an equivalent circuit of the ESD protection circuit according to other embodiments of the present invention.

FIG. 10 is an equivalent circuit diagram schematically illustrating another ESD protection circuit 4 with a tunable holding voltage in accordance with an embodiment of the present disclosure. The circuit 4 may be incorporated in to a semiconductor circuit and electrically coupled to a first pad 110, an internal circuit 120, and a second pad 130. A voltage on the first pad 110 is higher than a voltage on the second pad 130 during a normal operating condition. According to an embodiment, the first pad 110 is an I/O pad or a high voltage pad and the second pad 130 is a ground pad. According to other embodiments, the first pad 110 may be a VDD1 pad and the second pad 130 may be a VDD2 pad, or the first pad 110 may be a VSS1 pad and the second pad 130 may be a VSS2 pad. With the introduction of the ESD protection circuit 4, the internal circuit 120 can be protected from ESD damage or other electrostatic shock. The circuit 4 includes a snapback device 41 and a diode string 42 connected in series with the snapback device 41 for an ESD current to discharge from the first pad 110 to the second pad 130. The snapback device 41, as described above, exhibits the snapback behavior when ESD overstress occurs. In the circuit 4, the snapback device 41 is a low voltage triggered silicon controlled-rectifier device (LVTSCR), wherein an anode (P+) region of the LVTSCR device is coupled to the second pad 130, and a cathode (N+) region of the LVTSCR device is coupled to the second pad 130 through the diode string 12. By adjusting the number of diodes in the diode string 42, the holding voltage of the ESD protection circuit 4 based on the holding voltage of the snapback device 41 may be tuned to a level above the voltage on the first pad 110 under the normal operating condition, such as 10.5 V. Moreover, the ESD protection circuit 4 may include a reverse diode 43 for an ESD current to discharge from the second pad 130 to the first pad 110.

Figure 11:
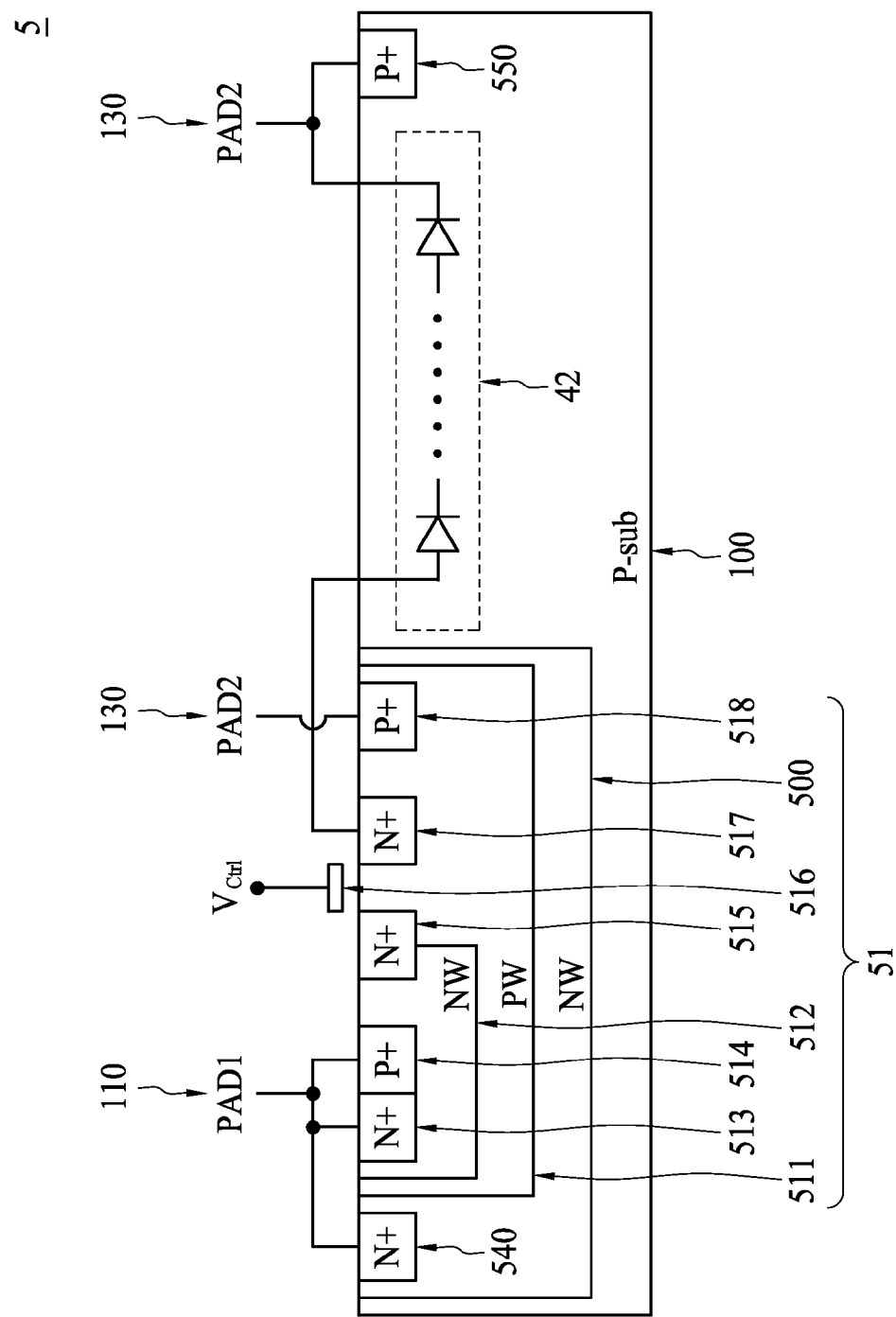
FIG. 11 depicts the semiconductor structure of an ESD protection circuit according to one embodiment.

An embodiment according to the present disclosure of a semiconductor structure of an ESD protection circuit 5 is depicted in FIG. 11. The ESD protection circuit 5 is electrically coupled between a first pad 110 and a second pad 130. A voltage on the first pad 110 is higher than a voltage on the second pad 130 under a normal operating condition. The ESD protection circuit 5 includes a substrate 100, a first well 500, a snapback device 51 and a diode string 42. In this embodiment, the substrate 100 is of a first conductivity type. The first well 500 of a second conductivity type is disposed in the substrate 100, wherein the first well 500 is coupled to the first pad 130. The snapback device 51 is housed in the first well 500. The diode string 42 is disposed in the substrate 100 and electrically connected in series with the snapback device 51 and separated from the first well 500, wherein the serially connected diode string 42 and the snapback device 51 is connected between the first pad 110 and the is second pad 130. In this embodiment, the first conductivity type is opposite to the second conductivity type. In this embodiment, the first well 500 is coupled to the first pad 110 through a more heavily doped region 540 of the second conductivity type in the first well 500. The substrate 100 is coupled to the second pad 130 through a more heavily doped region 550 of the first conductivity type in the substrate 100.

Referring still to FIG. 11, in this embodiment, the first conductivity type is a P-type and the second conductivity type is an N-type. In this embodiment, the snapback device 51 is an LVTSCR device. The snapback device 51 includes a P well 511 in the N-type first well 500, an N well 512 in the P well 511, an anode region 514 in the N well 512, and a cathode region 517 in the P well 511. The P well 511 and the cathode region 517 are coupled to the second pad 130, and the N well 512 and the anode region 514 are electrically connected to the first pad 110. In this embodiment, the cathode region 517 is electrically coupled to the second pad 130 through the diode string 42. The LVTSCR device is constructed by the PNP BJT transistor formed by the P+ anode region 514, the N well 512 and the P well 511, and also constructed by the NPN BJT transistor formed by the N well 512, the P well 511 and the N+ cathode region 517. The base and the collector of the PNP BJT transistor are respectively coupled to the collector and the base of the NPN BJT transistor. In addition, in order for the trigger voltage of the LVTSCR device to be sufficiently low to provide a more adequate ESD protection, the LVTSCR device in this embodiment further includes an NMOS of which the drain 515 is disposed over the junction of the N well 512 and the P well 511, the gate 516 is connected to a control voltage $V_{ctrl}$, and the source shares the same N+ doped region with the cathode region 517 of the LVTSCR device. The higher the control voltage $V_{Ctrl}$ on the gate 516 of the NMOS, the lower the trigger voltage at which the LVTSCR device turns on.

Figure 12:
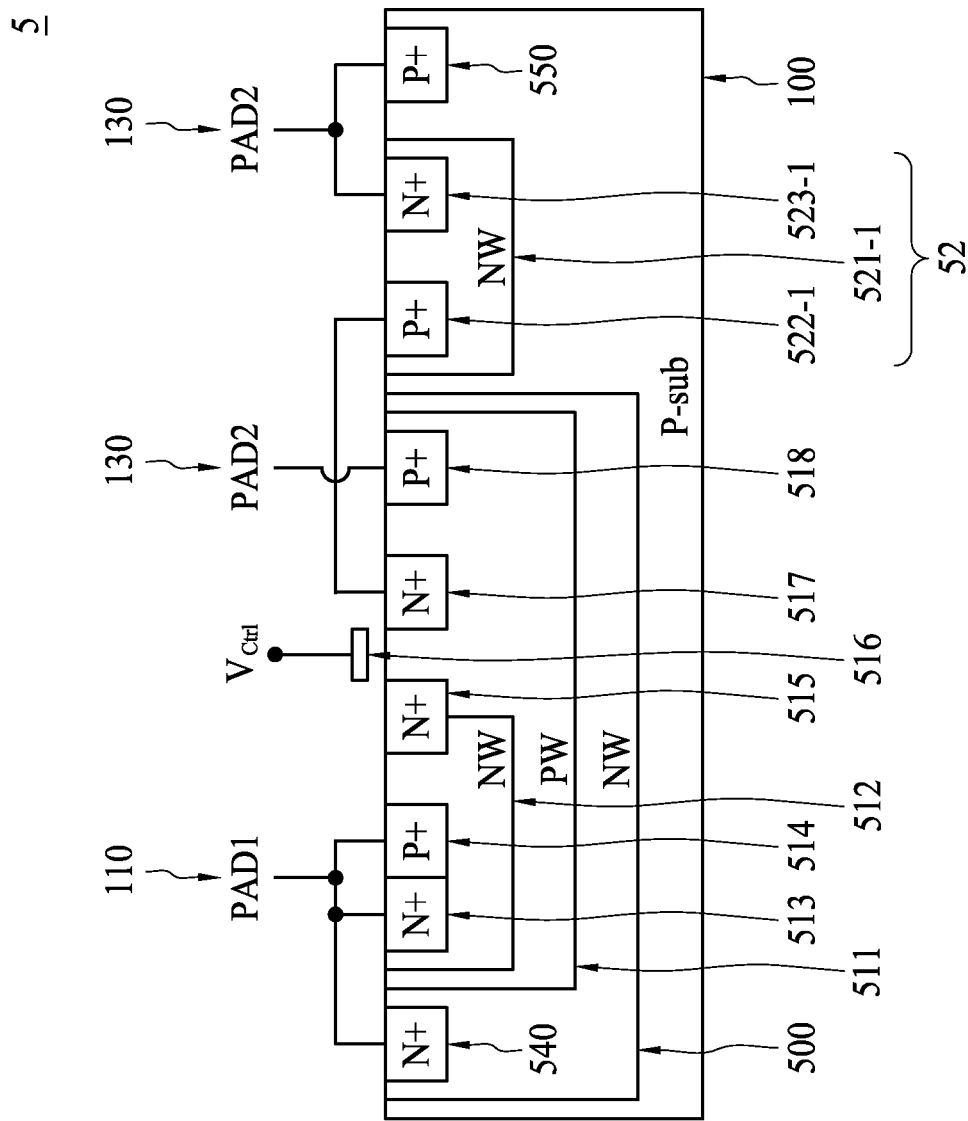
FIG. 12 depicts the representative cross-sectional drawing of an ESD protection circuit according to one embodiment.

Referring still to FIG. 11, by enclosing the snapback device 51 in the first well 500 coupled to the first pad 110, the holding voltage of the ESD is protection circuit 5 based on the holding voltage of the snapback device 51 may be tuned to a level above the voltage on the first pad 110 under the normal operating condition. FIG. 12 includes an example cross-sectional view of the diode string 42 shown in FIG. 11. Referring to both FIG. 11 and FIG. 12, when the first well 500 is not present, a parasitic silicon-controlled rectifier (SCR) path will be constructed by a PNP BJT transistor formed by a P+ doped region 514 and an N well 512 of the LVTSCR device and the P substrate 100, and also constructed by an NPN BJT transistor formed by the N well 512, the P substrate 100 and N+ doped region 523-1 in the N well 521-1 of a diode in the diode string 52. The PNP BJT transistor and the NPN BJT transistor form a positive feedback structure that can enter a regenerative current-conducting state and lower the holding voltage of the snapback device 51. By enclosing the snapback device 51 in the first well 500 coupled to the first pad 110, the parasitic SCR path is blocked and the holding voltage of the ESD protection circuit 5 based on the holding voltage of the snapback device 51 may be tuned to a level above the voltage on the first pad 110 under the normal operating condition without using a conventional guard ring structure. The guard ring structure, if exists, would be an additional N well with an N+ doped region and an additional P+ doped region present in the portion of the P-substrate 100 between the snapback device 51 and the diode string 42.

Referring back to FIG. 11, there is another diode which is the junction formed by a contact interface of the substrate 100 and the first well 500, wherein the diode is the reversal to the diode string 42 in view of the first pad 110.

The present embodiment provides at least two different channels for dissipating the ESD current introduced from different directions. When the discharging current is introduced into the circuit from the first pad 110 (i.e. in the forward ESD mode) the high current travels through the anode region 514, the N well 512, the P well 511 and the cathode region 517 of the LVTSCR device, the diode string 42, and then to the second pad 130. Conversely, when the discharging current is introduced from the second pad 130 (i.e. in the NS mode) the high current may dissipate through the substrate 100, the first well 500, and then to the first pad 110. By embedding the first well 500 in the substrate 100 to surround the snapback device 51 and directly coupling the first well 500 to the first pad 110, it becomes unnecessary to reserve an extra layout area to have a reverse diode for discharging NS mode ESD current.

Figure 13:
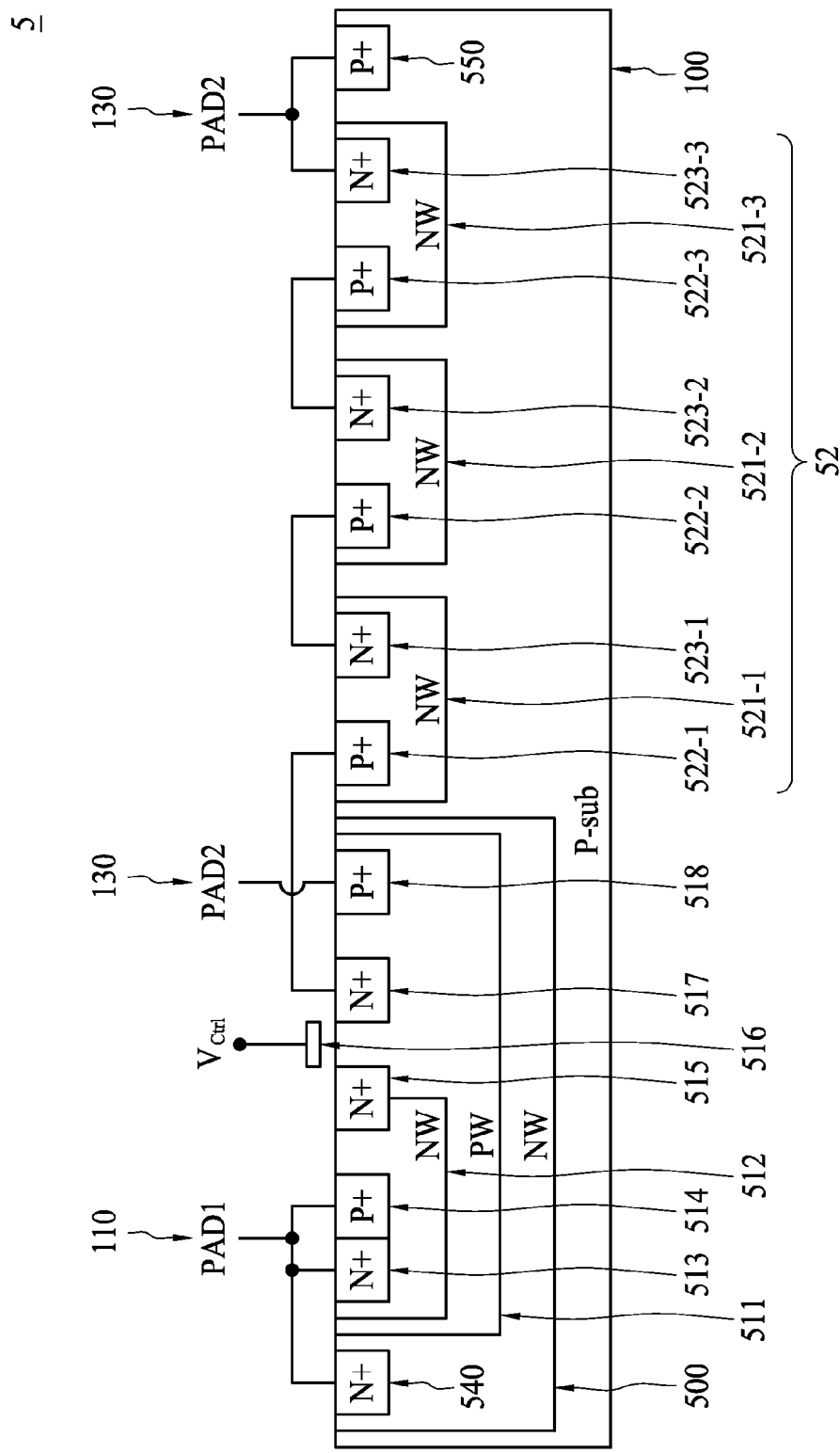
FIG. 13 depicts the representative cross-sectional drawing of an ESD protection circuit according to another embodiment.

FIG. 12 and FIG. 13 depict embodiments in which the diode string 52 includes a single diode and a plurality of diodes, respectively. Referring to both FIG. 12 and FIG. 13, the diode string 52 includes an end anode 522-1 and an end cathode 523-n, where n is equal to 1 in the example shown in FIG. 12 and is equal to 3 in the example shown in FIG. 13. The end anode 522-1 is coupled to the cathode region 517 of the snapback device and the end cathode 523-n is coupled to the second pad 130.

Figure 14:
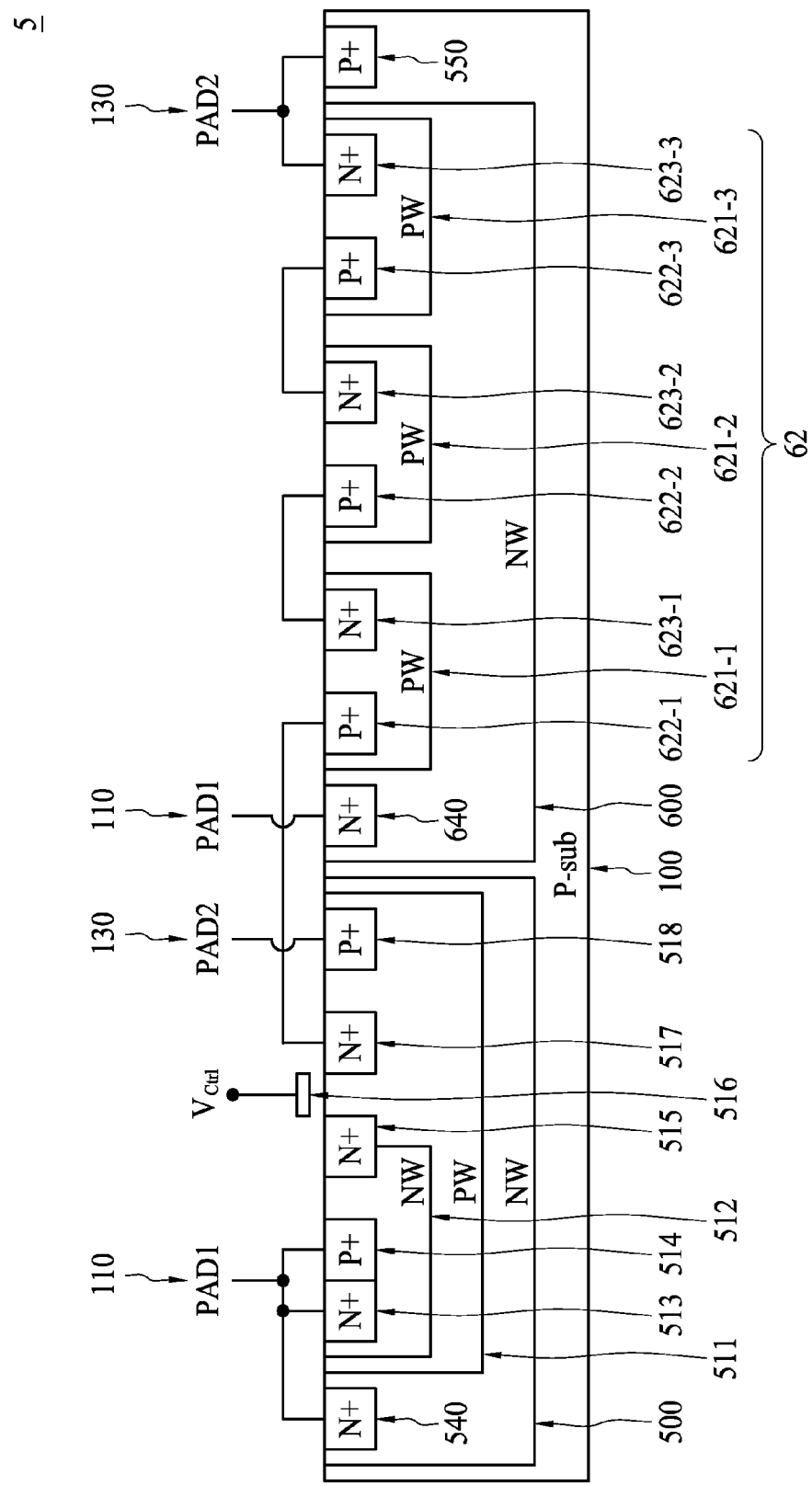
FIG. 14 depicts the representative cross-sectional drawing of an ESD protection circuit according to still another embodiment.

FIG. 14 depicts an embodiment in which the diode string 62 is housed in a second well 600. The second well 600 of the second conductivity type is embedded in the substrate 100, and is coupled to the first pad 110. The diode string 62 is enclosed in the second well 600 and each diode in the diode string 62 includes a diode well 621-x of the first conductivity type, an anode 622-x in the diode well 621-x, and a cathode 623-x in the diode well 621-x, where x denotes the $x_{th}$ diode in the diode string 62. In this embodiment, the second well 600 is coupled to the first pad 110 through a more heavily doped region 640 of the second conductivity type in the second well 600.

The embodiments illustrated in FIG. 13 and FIG. 14 are different in that the diode string 52 in FIG. 13 is directly embedded in the substrate 100 while the diode string 62 in FIG. 14 is enclosed by the second well 600 and then embedded in the substrate 100. During the normal operation, a bias voltage is applied on the first pad 110 in order to drive the internal circuit. Ideally, the ESD protection circuit 5 coupled to the first pad 110 should be non-current conducting to avoid any power consumption. Unfortunately, in the embodiment shown in FIG. 13, the P+ doped region 522-$x$ and the N well 521-$x$ of each diode in the diode string 52, and the P substrate 100 constitute a parasitic PNP BJT transistor and may form a channel for leakage. In particular, when the number of diodes in series increases, because the PNP BJT transistors are inherently in the Darlington transistor configuration, the leakage current of a PNP BJT transistor will be amplified by the next PNP BJT transistor. By replacing the N well 521-$x$ of each diode in the diode string 52 shown in FIG. 13 with a P well 621-$x$ in FIG. 14, and then enclosing the diode string 62 in the N well 600 coupled to the first pad 110, the electrical potential difference on the interface between the P well 621-$x$ and the N well 600 may form a barrier to the leakage current from the P well 621-$x$. For the first diode in the diode series 62, the electrical potential in the P well 621-1 may be equivalent to the electrical potential in the N well 600. But for the second and other subsequent diodes, the potential difference at an interface of the P well 621-$x$ and the N well 600 will be higher due to the voltage drop from the series connection, and the higher potential barriers formed outside the diodes can block the leakage. By further adjusting the doping concentration or profile of the wells, the embodiment may provide a higher potential barrier at the interface to block the leakage current. Therefore, the embodiment illustrated in FIG. 13 not only achieves tunable holding voltage without a guard ring structure, but also enhances power consumption under the normal operating condition.

Figure 15:
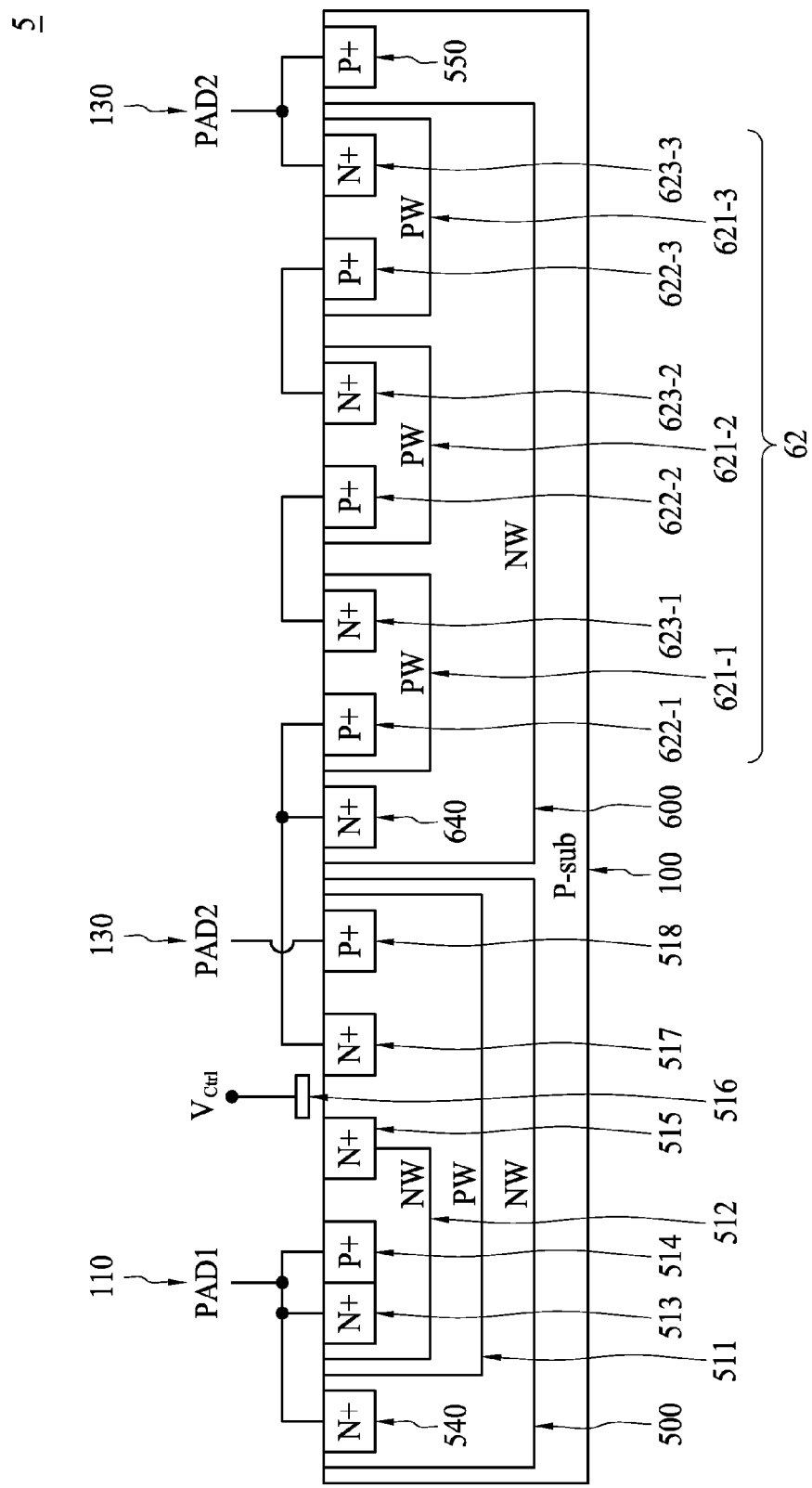
FIG. 15 depicts the representative cross-sectional drawing of an ESD protection circuit according to still another embodiment.

FIG. 15 illustrates another embodiment in which the second well 600 is coupled to the first pad 110 through the snapback device 51 (indicated in FIG. 11). This embodiment is different from the embodiment illustrated in FIG. 14 in that the second well 600 is coupled to the first pad 110 through the snapback device 51 instead of being directly coupled to the first pad 110.

Referring to FIG. 7, there is illustrated a representative cross-sectional view of an ESD protection circuit 2 according to an embodiment of the present disclosure. The ESD protection circuit 2 is coupled between a first pad 110 and a second pad 130. The voltage on the first pad 110 is higher than a voltage on the second pad 130 under a normal operation condition. The ESD protection circuit 2 includes a substrate 100 of a first conductivity type; a first well 200 of a second conductivity type in the substrate 100 and coupled to the first pad 110; a device well 211 of the first conductivity type in the first well 200 and coupled to the second pad 130; a first doped region 212 of the second conductivity type in the device well 211; a second doped region 214 of the second conductivity type in the device well 211 and coupled to the second pad 130; a first gate 213 between the first and second doped regions (212 and 214) and over the device well 211 and coupled to the second pad 130; and at least one diode region 22. Each diode region includes a diode well 221-1 within the substrate 100, a third doped region 222-1 of the first conductivity type in the diode well 221-1; and a fourth doped region 223-1 of the second conductivity type in the diode well 221-1, wherein the at least one diode region 22 is connected in series with the first doped region 212 and couples the first doped region 212 to the first pad 110. In this embodiment, the first well 200 is coupled to the first pad 110 through a more heavily doped region 240 of the second conductivity type in the first well 200. The substrate 100 is coupled to the second pad 130 through a more heavily doped region 250 of the first conductivity type in the substrate 100.

Referring still to FIG. 7, by arranging the device well 211 in the first well 200 coupled to the first pad 110, the holding voltage of the ESD protection circuit 2 may be tuned to a level above the voltage on the first pad 110 under the normal operating condition without using a conventional guard ring structure. The guard ring structure, if exists, would be inserted in the portion of the substrate 100 between the at least one diode region 22 and the first doped region 212. The holding voltage of the ESD protection circuit 2 can be tuned by adjusting the number of diode regions in the at least one diode region 22 as shown in FIG. 7 and FIG. 8.

Referring to FIG. 7, the present embodiment provides channels for dissipating both the forward ESD mode current and the NS mode ESD current, respectively. In the situation of the forward ESD mode, the ESD current is discharged sequentially from the first pad 110, the at least one diode region 22, the first doped region 212, the device well 211, the second doped region 214 to the second pad 130. Conversely, in the situation of the NS mode, the ESD current is dissipated sequentially from the second pad 130, the substrate 100, the first well 200 and then to the first pad 110.

Referring to FIG. 8, there is illustrated a representative cross-sectional view of an ESD protection circuit 2 according to another embodiment of the present disclosure. In this embodiment, the ESD protection circuit 2 further includes a fifth doped region 216 of the second conductivity type in the device well 211; and a second gate 217 between the fifth doped region 216 and the first doped region 212 and over the device well 211, wherein the at least one diode region 22 is connected in series with the fifth doped region 216, and couples the fifth doped region 216 to the first pad 130, and the second gate 217 is coupled to a control voltage. In this embodiment, the control voltage is equal to VDD.

Referring still to FIG. 8, in this embodiment, the first well 200 is coupled to the first pad 110 through coupling to a fourth doped region 223-$x$ of any diode region instead of directly coupling to the first pad 110 as illustrated in FIG. 7.

FIG. 9 depicts another embodiment in which the at least one diode region 32 is surrounded by a second well 300. The second well 300 of the second conductivity type is embedded in the substrate 100, and is coupled to the first pad 110. In this embodiment, the diode well 321-$x$ is of the first conductivity type. In this embodiment, the electrical potential difference on the interface between the diode well 321-$x$ and the second well 300 may form a barrier to a leakage current from the diode well 321-$x$ to the substrate 100.

In the embodiments described above, the first conductivity type may be a P-type and the second conductivity type may be an N-type.

Referring to FIG. 12, there is illustrated a representative cross-sectional view of an ESD protection circuit 5 according to an embodiment of the present disclosure. The ESD protection circuit 5 is coupled between a first pad 110 and a second pad 130. The voltage on the first pad 110 is higher than a voltage on the second pad 130 under a normal operation condition. The ESD protection circuit 5 includes a substrate 100 of a first conductivity type; a first well 500 of a second conductivity type in the substrate 100 and coupled to the first pad 110; a first device well 511 of the first conductivity type in the first well 200 and coupled to the second pad 130; a second device well 512 of the second conductivity type in the first device well 511 and coupled to the first pad 110; a first doped region 514 of the first conductivity type in the second device well 512 and coupled to the first pad 110; a second doped region 517 of the second conductivity type in the first device well 511; and at least one diode region 52. Each diode region includes a diode well 521-1 within the substrate 100, a third doped region 522-1 of the first conductivity type in the diode well 521-1; and a fourth doped region 523-1 of the second conductivity type in the diode well 521-1, wherein the at least one diode region 52 is connected in series with the second doped region 517 and couples the second doped region 517 to the second pad 130. In this embodiment, the first well 500 is coupled to the first pad 110 through a more heavily doped region 540 of the second conductivity type in the first well 500. The substrate 100 is coupled to the second pad 130 through a more heavily doped region 550 of the first conductivity type in the substrate 100.

Referring still to FIG. 12, by arranging the first device well 511 in the first well 500 coupled to the first pad 110, the holding voltage of the ESD protection circuit 5 may be tuned to a level above the voltage on the first pad 110 under the normal operating condition without using a conventional guard ring structure. The guard ring structure, if exists, would be inserted in the portion of the substrate 100 between the second doped region 517 and the at least one diode region 52. The holding voltage of ESD protection circuit 5 can be tuned by adjusting the number of diode regions in the at least one diode region 52 as shown in FIG. 12 and FIG. 13.

Referring to FIG. 12, the present embodiment provides channels for dissipating both the forward ESD mode current and the NS mode ESD current, respectively. In the situation of the forward ESD mode, the ESD current is discharged sequentially from the first pad 110, the first doped region 514, the second device well 512, the first device well 511, the second doped region 517, the at least one diode region 52 and then to the second pad 130. Conversely, in the situation of the NS mode, the ESD current is dissipated sequentially from the second pad 130, the substrate 100, the first well 500 and then to the first pad 110.

Referring to still to FIG. 12, in this embodiment, the ESD protection circuit 5 further includes a fifth doped region 515 of the second conductivity type disposed over the first and second device wells (511 and 512); and a gate 516 between the fifth doped region 515 and the second doped region 517 and over the first device well 511, wherein the gate 516 is coupled to a control voltage $V_{Ctrl}$. In this embodiment, the higher the control voltage $V_{Ctrl}$, the easier the ESD protection circuit 5 is turned on to discharge current.

FIG. 14 depicts another embodiment in which the at least one diode region 62 is surrounded by a second well 600. The second well 600 of the second conductivity type is embedded in the substrate 100, and is coupled to the first pad 110. In this embodiment, the diode well 621-x is of the first conductivity type. In this embodiment, the electrical potential difference on the interface between the diode well 621-x and the second well 600 may form a barrier to a leakage current from the diode well 621-x to the substrate 100.

FIG. 15 illustrates another embodiment in which the second well 600 is coupled to the first pad 110 through coupling to the second doped region 517 instead of directly coupling to the first pad 110 as illustrated in FIG. 14.

In the embodiments described above, the first conductivity type may be a P-type and the second conductivity type may be an N-type.

The methods and features of this invention have been sufficiently described in the above examples and descriptions. It should be understood that any modifications or changes without departing from the spirit of the invention are intended to be covered in the protection scope of the invention.

What is claimed is:

1. An electrostatic discharge (ESD) protection circuit coupled between a first pad and a second pad, a voltage on the first pad being higher than a voltage on the second pad under operation, wherein the ESD protection circuit comprises:
   a substrate of a first conductivity type;
   a first well of a second conductivity type in the substrate, wherein the first well is coupled to the first pad;
   a snapback device housed in the first well; and
   a diode string in the substrate, connected in series with the snapback device and separated from the first well, wherein the first well is coupled to the first pad or a cathode of the diode string.

2. The ESD protection circuit according to claim 1, wherein the diode string comprises at least one diode, and the number of diodes in the diode string is configured such that a holding voltage of the ESD protection circuit is higher than the voltage on the first pad under the normal operating condition.

3. The ESD protection circuit according to claim 1, wherein the snapback device comprises a first NMOS, wherein the first NMOS comprises a device well of the first conductivity type in the first well, a first drain, a first source and a first body in the device well, and a first gate over the device well, and the first gate, the first source and the first body of the first NMOS are coupled to the second pad.

4. The ESD protection circuit according to claim 3, wherein the snapback device further comprises:
   a second NMOS cascaded with the first NMOS, wherein the first NMOS shares the device well with the second NMOS, a second drain of the second NMOS is coupled to the first pad through the diode string, a second gate of the second NMOS is coupled to a control voltage and a source of the second NMOS and the second drain of the first NMOS are shared.

5. The ESD protection circuit according to claim 3, further comprising:
   a second well of the second conductivity type in the substrate, wherein the second well is coupled to the first pad, the diode string is housed in the second well, and each diode in the diode string comprises:
   a diode well of a first conductivity type;
   an anode in the diode well; and
   a cathode in the diode well,
      wherein one of the anodes is coupled to the first pad and the one of the cathodes is coupled to the first drain of the first NMOS.

6. The ESD protection circuit according to claim 3, wherein an ESD current is discharged sequentially from the first pad, the diode string, the first drain, the device well, the first source of the first NMOS to the second pad.

7. The ESD protection circuit according to claim 1, wherein the substrate is coupled to the second pad, and an ESD current is discharged sequentially from the second pad, the substrate, the first well to the first pad.

8. The ESD protection circuit according to claim 1, wherein the snapback device comprises a low-voltage triggered silicon-controlled rectifier (LVTSCR) device, the LVTSCR device comprises an anode region and a cathode region and the diode string comprises an end anode and an end cathode, the anode region of the LVTSCR device is coupled to the first pad, the cathode region of the LVTSCR device is coupled to the end anode of the diode string, and the end cathode of the diode string is coupled to the second pad.

9. The ESD protection circuit according to claim 8, further comprising
a second well of a second conductivity type in the substrate, wherein the second well is coupled to the first pad, the diode string is housed in the second well, and each diode in the diode string comprises:
a diode well of a first conductivity type;
an anode in the diode well; and
a cathode in the diode well.

10. The ESD protection circuit according to claim 8, wherein an ESD current is discharged sequentially from the first pad, the anode region of the LVTSCR device, the cathode region of the LVTSCR device, the diode string to the second pad.

11. The ESD protection circuit according to claim 8, wherein the substrate is coupled to the second pad, and an ESD current is discharged sequentially from the second pad, the substrate, the first well to the first pad.

12. An electrostatic discharge (ESD) protection circuit coupled between a first pad and a second pad, a voltage on the first pad being higher than a voltage on the second pad under operation, wherein the ESD protection circuit comprises:
a substrate of a first conductivity type;
a first well of a second conductivity type in the substrate and coupled to the first pad;
a device well of the first conductivity type in the first well and coupled to the second pad;
a first doped region of the second conductivity type in the device well;
a second doped region of the second conductivity type in the device well and coupled to the second pad;
a first gate between the first and second doped regions and over the device well and coupled to the second pad; and
at least one diode region, wherein each diode region comprises:
a diode well within the substrate;
a third doped region of the first conductivity type in the diode well; and
a fourth doped region of the second conductivity type in the diode well, wherein the at least one diode region is connected in series with the first doped region and couples the first doped region to the first pad,
wherein the first well is coupled to the first pad by directly coupling to the first pad or by coupling to a fourth doped region of any diode region.

13. The ESD protection circuit according to claim 12, wherein the number of diode regions in the at least one diode region is configured such that a holding voltage of the ESD protection circuit is higher than the voltage on the first pad under the normal operating condition.

14. The ESD protection circuit according to claim 12, further comprising:
a fifth doped region of the second conductivity type in the device well; and
a second gate between the fifth doped region and the first doped region and over the device well, wherein the at least one diode region is connected in series with the fifth doped region, and couples the fifth doped region to the first pad, and the second gate is coupled to a control voltage.

15. The ESD protection circuit according to claim 12, further comprising:
a second well of the second conductivity type in the substrate, wherein the second well is coupled to the first pad, the at least one diode region is housed in the second well, and the diode well is of the first conductivity type.

16. The ESD protection circuit according to claim 12, wherein an ESD current is discharged sequentially from the first pad, the at least one diode region, the first doped region, the device well, the second doped region to the second pad.

17. The ESD protection circuit according to claim 12, wherein when the first well is coupled to the first pad by directly coupling to the first pad, and the substrate is coupled to the second pad, an ESD current is discharged sequentially from the second pad, the substrate, the first well to the first pad.

18. An electrostatic discharge (ESD) protection circuit coupled between a first pad and a second pad, a voltage on the first pad being higher than a voltage on the second pad under operation a normal operating condition, wherein the ESD protection circuit comprises:
a substrate of a first conductivity type;
a first well of a second conductivity type in the substrate and coupled to the first pad;
a first device well of the first conductivity type in the first well and coupled to the second pad;
a second device well of the second conductivity type in the first device well and coupled to the first pad;
a first doped region of the first conductivity type in the second device well and coupled to the first pad;
a second doped region of the second conductivity type in the first device well;
at least one diode region, wherein each diode region comprises:
a diode well within the substrate;
a third doped region of the first conductivity type in the diode well;
a fourth doped region of the second conductivity type in the diode well, wherein the at least one diode region is connected in series with the second doped region and couples the second doped region to the second pad, and
a second well of the second conductivity type in the substrate, wherein the second well is coupled to the first pad by directly coupling to the first pad or by coupling to the second doped region.

19. The ESD protection circuit according to claim 18, wherein the number of the diode regions in the at least one diode region is configured such that a holding voltage of the ESD protection circuit is higher than the voltage on the first pad under the normal operating condition.

20. The ESD protection circuit according to claim 18, further comprising at least one diode region housed in the second well, and the diode well is of the first conductivity type.

21. The ESD protection circuit according to claim 18, wherein an ESD current is discharged sequentially from the first pad, the first doped region, the second device well, the first device well, the second doped region, the at least one diode region to the second pad.

22. The ESD protection circuit according to claim 18, wherein an ESD current is discharged sequentially from the second pad, the substrate, the first well to the first pad.

* * * * *